United States Patent [19]

Chen

[11] Patent Number: 5,838,164
[45] Date of Patent: Nov. 17, 1998

[54] METHOD OF MEASURING THE THRESHOLD VOLTAGE OF METAL-OXIDE SEMICONDUCTOR FIELD-EFFECT TRANSISTORS

[75] Inventor: Shen-Li Chen, Chang-Hwa, Taiwan

[73] Assignee: United Microelectronics Corporation, Taiwan

[21] Appl. No.: 689,995

[22] Filed: Aug. 16, 1996

[30] Foreign Application Priority Data

Jun. 7, 1996 [TW] Taiwan ................................ 85106828

[51] Int. Cl.$^6$ .................................................. G01R 31/26
[52] U.S. Cl. ........................................................ 324/769
[58] Field of Search ..................................... 324/768, 769

[56] References Cited

U.S. PATENT DOCUMENTS 5,495,166   2/1996   Alini et al. ............................... 323/314

OTHER PUBLICATIONS

S. Jain, "Measurement of Threshold Voltage and Channel Length of Submicron MOSFETs," IEEE Proceedings, vol. 135, Pt. 1, No. 6, pp. 162–164, Dec. 1988.

Zhenhua Wang, "Direct, Fast, and Accurate Measurement of Vt and K of an MOS Transistor Using a Vt–Sift Circuit," IEEE Transactions on Instrumentation and Measurement, vol. 40, No. 6, pp. 951–955, Dec. 1991.

Colin C. McAndrew, et al, "MOSFET Effective Channel Length, Threshold Voltage, and Series Resistance Determination by Robust Optimization," IEEE Transactions on Electron Devices, vol. 39, No. 10, pp. 2298–2311, Oct. 1992.

*Primary Examiner*—Vinh P. Nguyen
*Assistant Examiner*—Russell M. Kobert
*Attorney, Agent, or Firm*—Rabin, Champagne, & Lynt, P.C.

[57] ABSTRACT

A method for accurately measuring the threshold voltage of a MOSFET device. A variable DC voltage is connected between the drain and the source, and the source and the substrate are grounded. The drain-to-source voltage is varied among a first predetermined number of levels in a first range that approaches zero volts. The value of one K parameter for each level of the drain-to-source voltage is obtained. A curve representing the K parameter versus drain-to-source voltage characteristic is plotted. The intercept of the curve with the K parameter axis, by linear extrapolation of the curve is obtained, the intercept represents the threshold voltage of the MOSFET device.

7 Claims, 9 Drawing Sheets

METHOD OF MEASURING THE THRESHOLD VOLTAGE OF METAL-OXIDE SEMICONDUCTOR FIELD-EFFECT TRANSISTORS

BACKGROUND OF THE INVENTION

1. Field of the Invention

The invention relates to semiconductor technologies, and more particularly, to a method of measuring the threshold voltage of metal-oxide semiconductor field-effect transistor (MOSFET) devices.

2. Description of the Related Art

In a MOSFET device, the lowest gate-to-source voltage that would cause a current to start or stop flowing through the drain-to-source channel is referred to as the threshold voltage of the MOSFET device. The threshold voltage is an important parameter of the MOSFET device that should be measured precisely and given on the manufacturer's specification sheets before supplying the device to the customer, so that circuit designers can accordingly devise proper circuits that allow the MOSFET device to operate properly. Therefore, it is an essential task for the manufacturer to measure the threshold voltage of MOSFET devices before supplying them to the customer.

Several conventional methods for measuring the threshold voltage of a MOSFET device are known. They include, for example, the Linearly Extrapolated Method, the Constant Current Method, and the Transconductance Maximum Method.

The Linearly Extrapolated Method

According to this method, a constant voltage of $V_{DS}=0.1V$ is applied between the drain and the source of the MOSFET device, and concurrently a variable voltage $V_{GS}$, which is varied from 0V to 5V in steps of 0.1V, is applied between the gate and the source. Under this setup, the drain-to-source current $I_{DS}$ is measured for each level of $V_{GS}$. The results of the measurements taken from a double diffused drain (DDD) n-channel MOSFET device are plotted in FIG. 1 and those taken from a lightly doped drain (LDD) n-channel MOSFET device are plotted in FIG. 2, in which the horizontal axis (abscissa) represents $V_{GS}$ and the vertical axis (ordinate) represents $I_{DS}$. Connecting all the points of the $I_{DS}$ versus $V_{GS}$ data by lines, the resultant curve as indicated by $C_1$ shows a plot of the $I_{DS}$ versus $V_{GS}$ characteristic of the MOSFET device.

Figure 1:
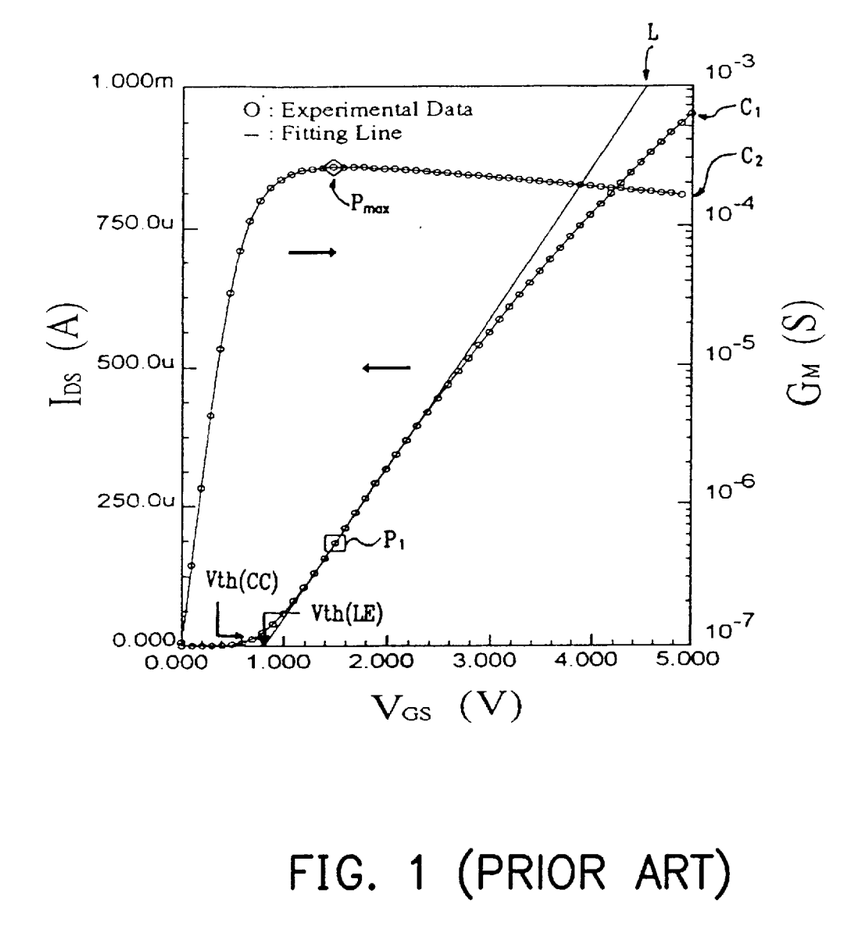
FIG. 1 is a graph, showing plots of drain-to-source current $I_{DS}$ and transconductance $G_M$ versus gate-to-source voltage $V_{GS}$ for a DDD-structured n-channel MOSFET.
Figure 2:
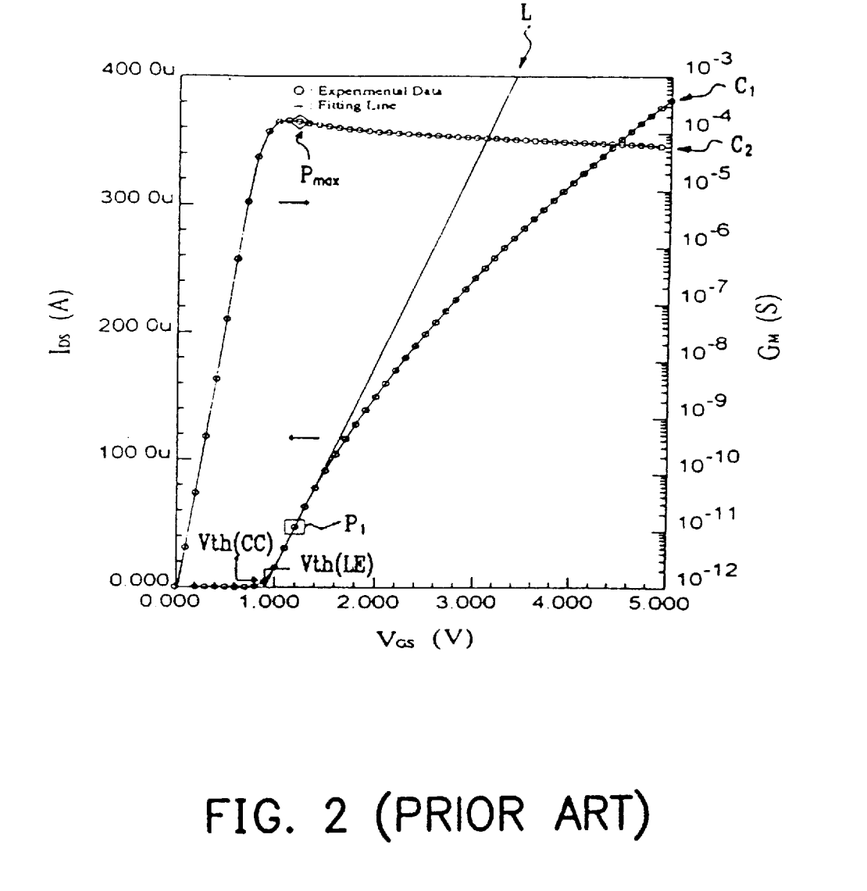
FIG. 2 is a graph, showing plots of drain-to-source current $I_{DS}$ and transconductance $G_M$ versus gate-to-source voltage $V_{GS}$ for an LDD-structured n-channel MOSFET.

In MOSFET devices, the derivative of $I_{DS}$ with respect to $V_{GS}$ (i.e., $\partial I_{DS}/\partial V_{GS}$) is referred to as the transconductance $G_M$, which denotes the ratio of drain-to-source current with respect to a change in gate-to-source voltage at each level of $V_{GS}$. A plot of $G_M$ versus $V_{GS}$ as indicated by $C_2$ is also given on the graph. On the plot of $G_M$ versus $V_{GS}$, the point where the maximum value of $G_M$ occurs is indicated by $P_{max}$. Projecting straight downwards from $P_{max}$, the intercept point on the plot of $I_{DS}$ versus $V_{GS}$, as indicated by $P_1$, is the point where the maximum slope (i.e., $\partial I_{DS}/\partial V_{GS}$) occurs.

By linear extrapolation, the line of maximum slope as indicated by L is extended downwards to intercept the $V_{GS}$ axis (the horizontal axis) at a point indicated by $V_{th}(LE)$. The value of $V_{th}(LE)$ is then taken as the threshold voltage of the MOSFET device in the manufacturer's specifications.

The purpose of applying the constant voltage of $V_{DS}=0.1V$ between the drain and the source of the MOSFET device is to allow the MOSFET device to operate as closely as possible in a linear region, i.e., to allow the $I_{DS}$ versus $V_{GS}$ characteristic plot to be as straight as possible within the 0V-to-5V range set for the measurements. However, it is obvious, and can be seen from FIG. 1 and FIG. 2, that the plot are close to a straight line only in the middle and is significantly curved near the bottom, which makes the value of the threshold voltage obtained by the foregoing method far from accurate.

The Constant Current Method

According to this method, a constant voltage of $V_{DS}=0.1V$ is applied between the drain and source of the MOSFET device, and concurrently a variable voltage $V_{GS}$, which is varied from 0V to 5V in steps of 0.1V, is applied between the gate and the source. Under this setup, the drain-to-source current $I_{DS}$ is measured for each level of $V_{GS}$. The results of the measurements taken from a DDD n-channel MOSFET device are plotted in FIG. 1 and those taken from an LDD n-channel MOSFET device are plotted in FIG. 2, in which the horizontal axis represents $V_{GS}$ and the vertical axis represents $I_{DS}$.

After that, a small constant current, for example $I_{CC}=10^{-7}$ A, is arbitrarily selected from the range of 40 pA to 1 μA. The selected value of $I_{CC}$ is then multiplied by the width-to-length ratio of the channel of the MOSFET device to obtain a current value $I_{th}$, which represents the current flowing through the drain-to-source channel when the threshold voltage of the MOSFET device is applied between the gate and the source.

From the plot $C_1$ of FIG. 1, the value of $V_{GS}$ corresponding to the value of $I_{th}$ can be found, which is designated by $V_{th}(CC)$ on the graph. The value of $V_{th}(CC)$ is then taken as the threshold voltage of the DDD n-channel MOSFET device in the manufacturer's specifications.

Similarly from the plot $C_1$ of FIG. 2, the value of $V_{GS}$ corresponding to the value of $I_{th}$ can be found; which is designated by $V_{th}(CC)$ on the graph. The value of $V_{th}(CC)$ is then taken as the threshold voltage of the LDD n-channel MOSFET device in the manufacturer's specifications.

In this method, since the value of $I_{CC}$ can be arbitrarily specified at any value from 40 pA to 1 μA, the value obtained for the threshold voltage is merely based on a rough estimation of the current $I_{CC}$, which is generally considered to be an inaccurate way of measuring the threshold voltage.

The Transconductance Maximum Method

As stated earlier, the threshold voltage is the lowest gate-to-source voltage that would cause a current to start or stop flowing through the drain-to-source channel. Thus, theoretically the maximum value of $$\partial G_m/\partial V_{GS}$$

would occur at the threshold voltage.

According to the Transconductance Maximum Method, a constant voltage of $V_{DS}=0.1V$ is applied between the drain and source of the MOSFET device, and concurrently a variable voltage $V_{GS}$, which is varied from 0V to 5V in steps of 0.1 V, is applied between the gate and source. Under this setup, the drain-to-source current $I_{DS}$ is measured for each level of $V_{GS}$. Based on the measured data, a plot of $I_{DS}$ versus $V_{GS}$, as indicated by $C_1$ in FIG. 3, can be obtained. Also, a set of values of $\partial I_{DS}/\partial V_{GS}$ can be determined, which can be further used to obtain a set of values of $\partial G_M/\partial V_{GS}$ versus $V_{GS}$. A plot of $\partial G_M/\partial V_{GS}$ versus $V_{GS}$ is indicated by $C_2$ in FIG. 3.

Figure 3:
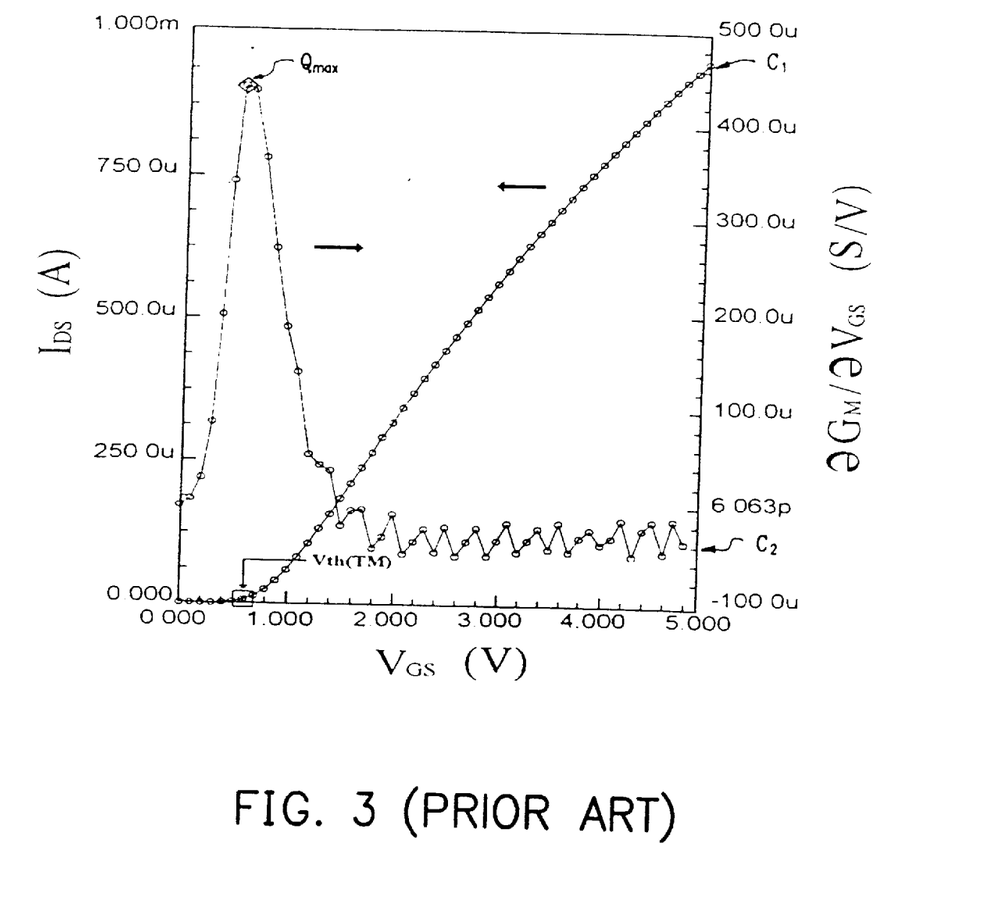
FIG. 3 is a graph, showing plots of drain-to-source current $I_{DS}$ and $\partial G_M/\partial V_{GS}$ versus gate-to-source voltage $V_{GS}$ for a DDD-structured n-channel MOSFET.

On the plot $C_2$, the peak value of $\partial G_M/\partial V_{GS}$ is indicated by $Q_{max}$. The value of $V_{GS}$ corresponding to $Q_{max}$, as indicated by $V_{th}$(TM) in FIG. 3, is then taken as the threshold voltage of the DDD n-channel MOSFET device in the manufacturer's specifications.

Figure 4:
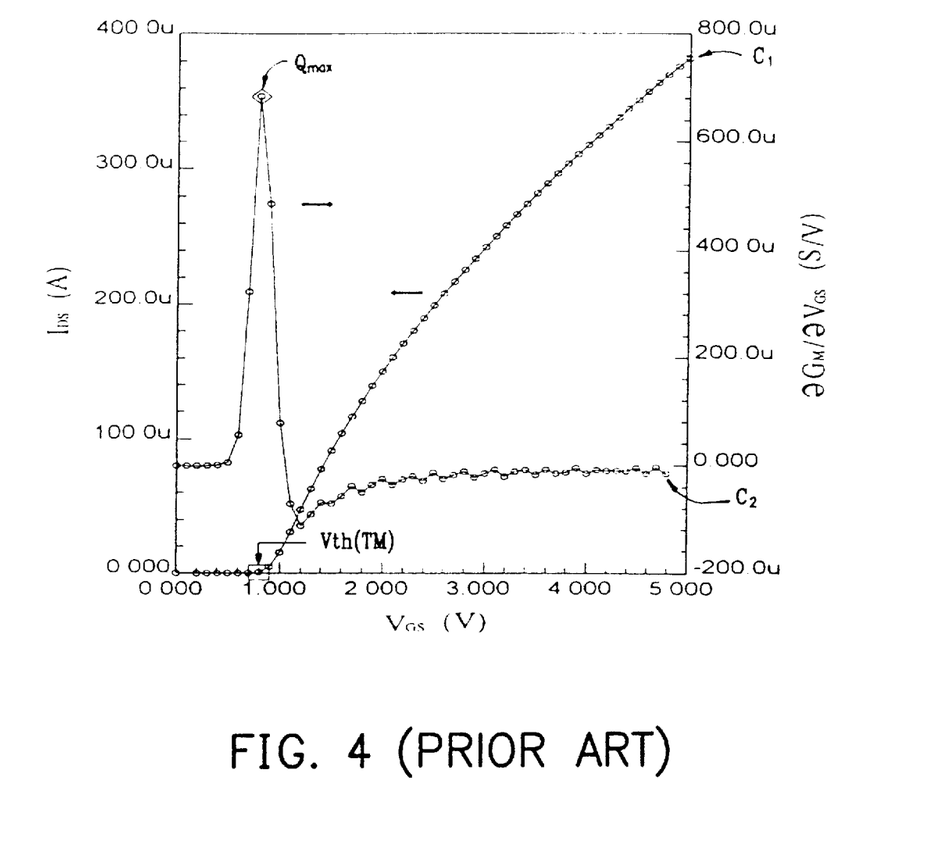
FIG. 4 is a graph, showing plots of drain-to-source current $I_{DS}$ and $\partial G_M/\partial V_{GS}$ versus gate-to-source voltage $V_{GS}$ for an LDD-structured n-channel MOSFET.

Furthermore, FIG. 4 shows the plots of $I_{DS}$ and $\partial G_M/\partial V_{GS}$ versus $V_{GS}$ for an LDD n-channel MOSFET device, and the value of $V_{th}$(TM) obtained by the Transconductance Maximum Method. The value of $V_{th}$(TM) is then taken as the threshold voltage of the LDD n-channel MOSFET device in the manufacturer's specifications.

In the aforementioned three conventional methods, the measurements are all carried out under a constant level of $V_{DS}$ as 0.1V, which allows the MOSFET device to operate in a substantially linear region. The larger is this value of $V_{DS}$, the larger will be the inaccuracy of the measured data; while the smaller is this value, the more difficult the measurements will be to carry out. None of these conventional methods can give threshold voltage values that are satisfactorily accurate. There exists, therefore, a need for an improved method that can be used to measure the threshold voltage of MOSFET devices more accurately.

SUMMARY OF THE INVENTION

It is therefore an object of the invention to provide a method for testing a MOSFET device, to obtain a more accurate estimation of its threshold voltage.

In accordance with the foregoing and other objects of the invention, a new and improved method for measuring the threshold voltage of MOSFET devices is provided. The method includes applying a variable DC voltage between the drain and the source, and connecting the source and the substrate to ground. The drain-to-source voltage is varied among a first predetermined number of levels in a first range. The value of one K parameter for each level of the drain-to-source voltage is obtained and plotted to provide a curve which represents the K parameter versus drain-to-source voltage characteristic. The intercept of the curve with the K parameter axis is obtained by linear extrapolation, wherein the intercept represents the threshold voltage of the MOSFET device. The step of obtaining the value of one K parameter for each level of the drain-to-source voltage, includes applying a variable DC voltage between the gate and the source, and varying the gate-to-source voltage among a predetermined number of levels in a second range. The step also includes measuring the current flowing from the drain to the source for each level of the gate-to-source voltage, and plotting a curve which represents the drain-to-source current versus gate-to-source voltage characteristic. The position of a point on the plot which gives the maximum slope to a line tangential to that point is determined and the value of the one K parameter is obtained by linear extrapolation of the line of maximum slope to the gate-to-source axis.

BRIEF DESCRIPTION OF DRAWINGS

The invention will be more fully understood from the following detailed description of the preferred embodiment, with reference to the accompanying drawings, wherein.

DETAILED DESCRIPTION OF PREFERRED EMBODIMENT

In the following detailed description of the preferred embodiment of the invention, the principle on which the invention is based will be described first. Then, examples of the measurements will be given for two types of MOSFET devices, a DDD n-channel MOSFET device and an LDD n-channel MOSFET device. The method according to the invention is termed herein a "bulk charge varying (BCV) method".

Principle

In a MOSFET device, the inversion charge $Q_i(y)$ along the channel (the y direction) can be expressed by Eq.(1):

$$Q_i(y) = -C_{ox} \cdot [V_{gs} - V_{th} - (1+\delta \cdot \gamma)V(y)] \ldots \quad (1)$$

where $C_{ox}$ is the capacitance per unit area of the gate oxide layer;

$V_{gs}$ is the voltage between the gate and the source;

$V_{th}$ is the threshold voltage of the MOSFET device being evaluated; and $V(y)$ is the channel potential across the channel.

Meanwhile, $$\delta = \frac{0.5}{\sqrt{2\phi_f + V_{sb}}} \left[ 1 - \frac{V}{30 \cdot (2\phi_f + V_{sb})} \right] = \delta_0 - \delta_1 \cdot V \quad (2)$$

$$\delta_0 = 0.5/(2\phi_f + V_{sb})^{1/2} \ldots \quad (3)$$

$$\delta_1 = 1/[60 \cdot (2\phi_f + V_{sb})^{3/2}] \ldots \quad (4)$$

and γ is the body factor given below:

$$\delta = (2\epsilon_0 \cdot \epsilon_{si} \cdot q \cdot N_b)^{1/2}/C_{ox} \ldots \quad (5)$$

where

φf is the Fermi potential $V_{sb}$ is the voltage across the source and bulk $\epsilon_0$ is the permittivity of free space;

$\epsilon_{si}$ is the relative dielectric constant of silicon;

q is the elementary charge;

$N_b$ is the bulk concentration of the substrate;

The channel current can be obtained by integrating $Q_i(y)$ in the y-direction. Thus, in the linear region, the drain-to-source current $I_{DS}$ can be expressed as follows:

$$I_{DS} = \mu_s \cdot C_{ox} \cdot W \cdot [V_{GS} - V_{th} - 0.5 \cdot \alpha \cdot V_{DS}] \cdot V_{DS}/L \ldots \quad (6)$$

where $\mu_s$ is the surface mobility of the charge carrier through the channel;

W is the width of the channel;

L is the length of the channel; and $V_{DS}$ is the drain-to-source voltage.

$\alpha$ is the body-effect charge sharing factor

In accordance with Eqs. (1) and (2), the body-effect charge sharing factor $\alpha$ can be defined as follows:

$$\frac{1}{2}\alpha = \frac{1+\delta_0 \cdot \gamma}{2} - \frac{\delta_{-1} \cdot \gamma}{3} V_{DS} \equiv \alpha_0 - \alpha_1 \cdot V_{DS} \quad (7)$$

where $$\alpha_0 = \frac{1+\delta_0 \cdot \gamma}{2} \quad (8)$$

$$\alpha_1 = \frac{\delta_1 \cdot \gamma}{3} \quad (9)$$

The intercept with the $V_{GS}$ axis (where $I_{DS}=0$), of the linear extrapolation of the plot of $I_{DS}$ versus $V_{GS}$ from the point of maximum slope, is defined as the K parameter.

From Eq. (6), it can be derived that:

$$K = V_{th} + 0.5 \cdot \alpha \cdot V_{DS} \ldots \quad (10)$$

or equivalently, $$K = V_{th} + \alpha_0 \cdot V_{DS} - \alpha_1 \cdot V_{DS}^2 \ldots \quad (11)$$

Thus, when there is a change in $V_{DS}$, the intercept (i.e., the value of the K parameter) with the $V_{GS}$ axis, will change correspondingly. Accordingly, a set of K parameters can be obtained for various levels of $V_{DS}$, and the threshold voltage of the MOSFET device can be obtained by taking the intercept of the plot of K versus $V_{DS}$ characteristic, by linear extrapolation to the K axis (where $V_{DS}=0$). Mathematically, this notion can be expressed as follows:

$$V_{th} = \lim_{V_{IN} \to 0} K \quad (12)$$

Procedural Steps and Examples of the Measurements

Figure 5:
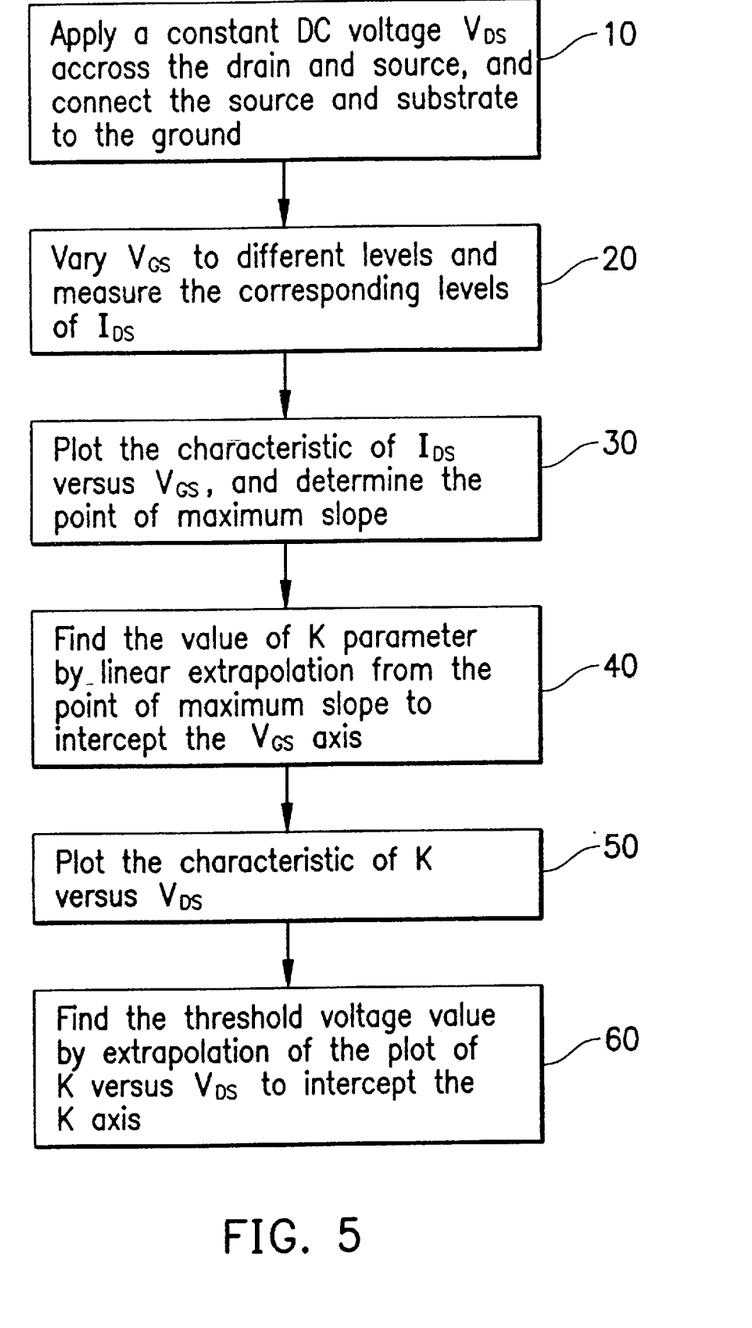
FIG. 5 is a flow chart showing the steps involved in the method according to the invention for measuring the threshold voltage of a MOSFET device.

FIG. 5 shows a flow chart depicting the steps involved in the method according to the invention for measuring the threshold voltage of a MOSFET device. In the example depicted here, the MOSFET device is an n-channel MOSFET device, which is placed during measurement in a shielded test fixture free of electromagnetic interference.

In this method, the first step 10 is to apply a variable DC voltage $V_{DS}$ between the drain and the source of the n-channel MOSFET device, and connect the source and the substrate to ground. The variable voltage $V_{DS}$ is varied in a first range, for example, from 0.1V to 1V. In particular, $V_{DS}$ is varied among a first predetermined number of levels in the first range, with a increment between the levels of 0.1V.

In the subsequent step 20, a variable DC voltage $V_{GS}$ is applied between the gate and source of the n-channel MOSFET device. This gate-to-source voltage $V_{GS}$ is varied in a second range, for example, from 0V to 5V in incremental steps of 0.1V. Thus, $V_{GS}$ is varied within this second range over the first range of $V_{DS}$.

Under this setup, the drain-to-source current $I_{DS}$ of the n-channel MOSFET device is measured for each level of $V_{GS}$.

Figure 6A:
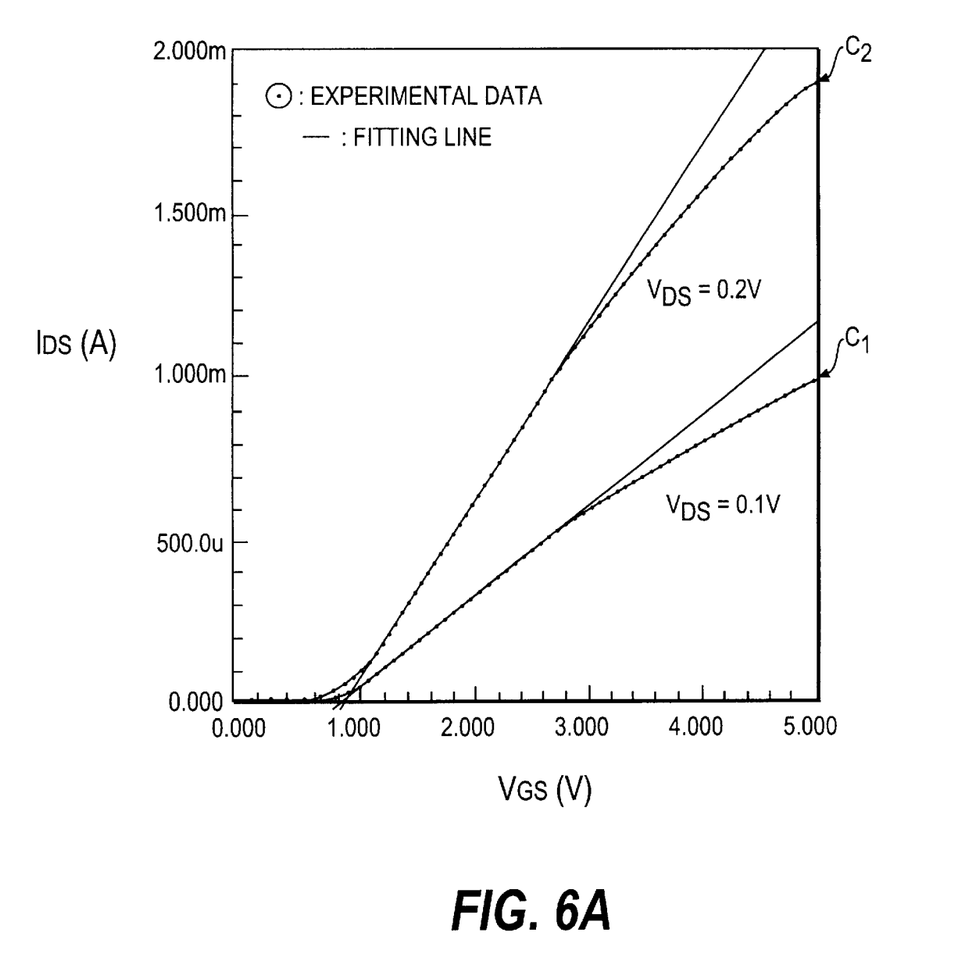
FIG. 6a is a graph showing two plots of $I_{DS}$ versus $V_{GS}$ at two different levels of $V_{DS}$ for an n-channel MOSFET when measuring its threshold voltage by the method according to the invention and FIG. 6b is an expanded view of the plot of FIG. 6a in the area of the $V_{GS}$ intercept of the plot.

In the subsequent step 30, the measured data of $I_{DS}$ with respect to $V_{GS}$ are plotted on a graph with $V_{GS}$ along the horizontal axis and $I_{DS}$ along the vertical axis, as indicated by plot $C_1$ in FIG. 6a. After that, the point on the plot that corresponds to the maximum transconductance (i.e., the point for which a line tangential to the point has the maximum value of $\partial I_{DS}/\partial V_{GS}$, or slope) is determined.

Figure 6B:
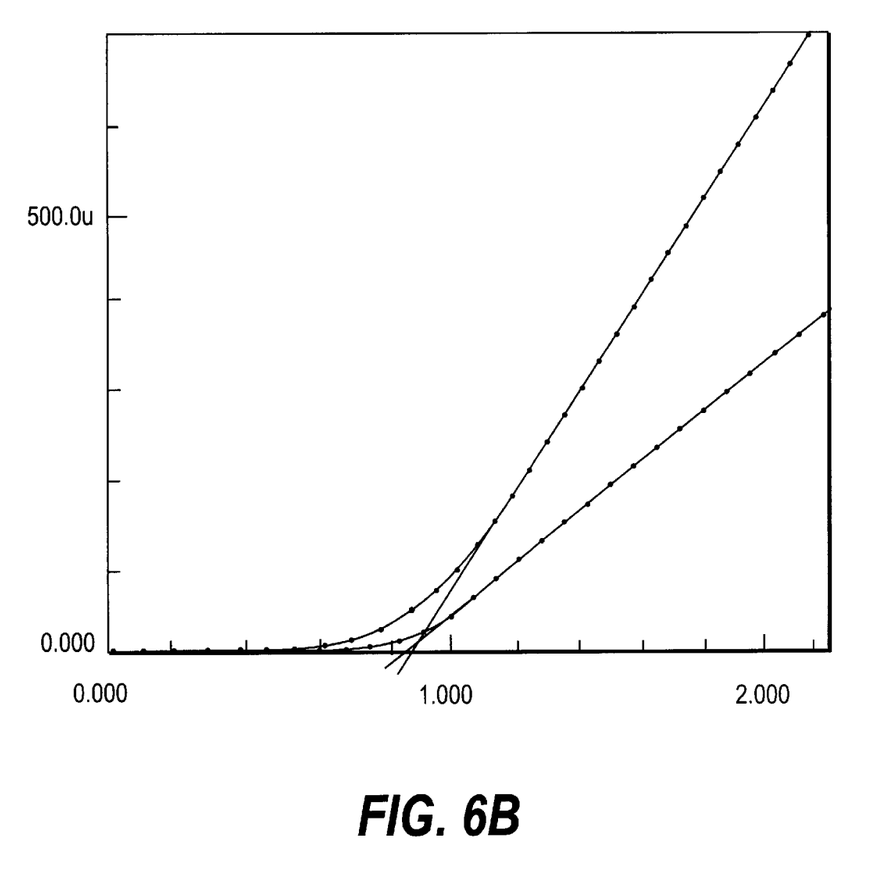

In the next step 40, linear extrapolation is used to extend the maximum slope to intercept the $V_{GS}$ axis (the horizontal axis) at a point whose value is recorded as one value of the K parameter, as shown in FIG. 6b. In the subsequent step 50, the drain-to-source voltage $V_{DS}$ is varied by a predetermined increment of, for example, 0.1V to the next level, and the foregoing steps 30 and 40 are repeated to obtain another value of the K parameter, corresponding to the present level of $V_{DS}$. This step is repeated until a set of K parameters is obtained corresponding to all the levels of $V_{DS}$. FIG. 6 shows, for example, plots of $I_{DS}$ versus $V_{GS}$ at two different levels of $V_{DS}$ ($V_{DS}=0.1V$ and $V_{DS}=0.2V$) for an n-channel MOSFET.

Figure 7:
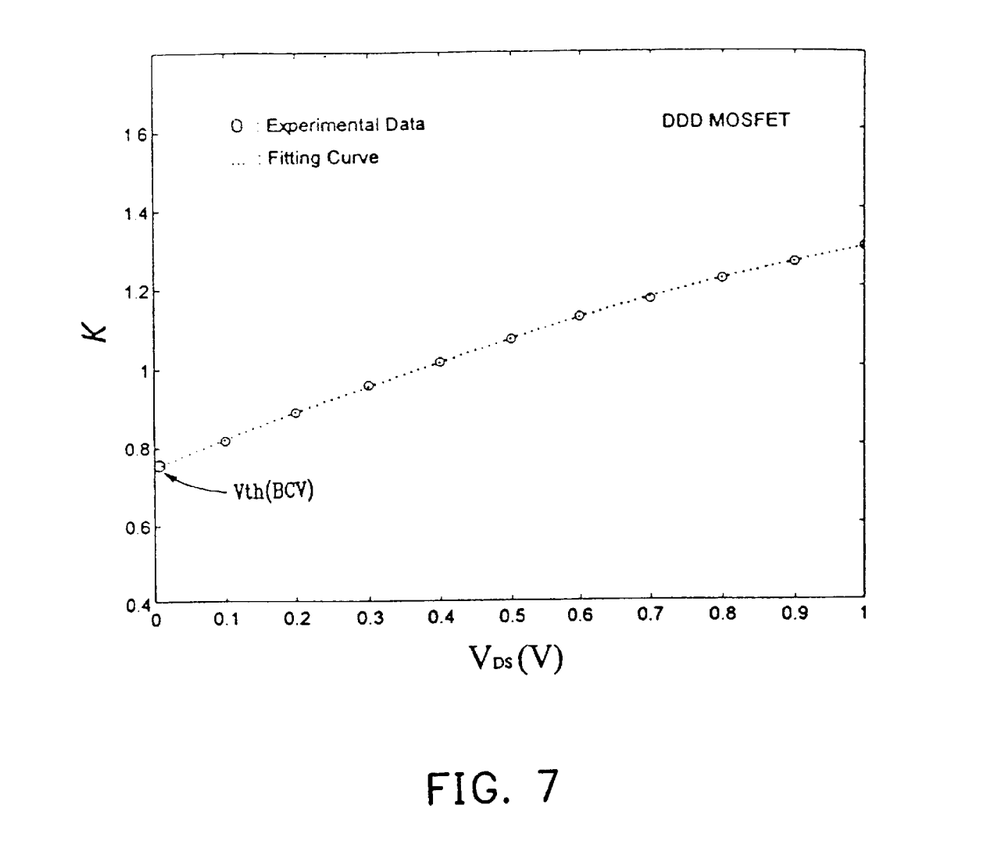
FIG. 7 is a graph, showing a plot of K parameter versus $V_{DS}$ for a DDD n-channel MOSFET device.
Figure 8:
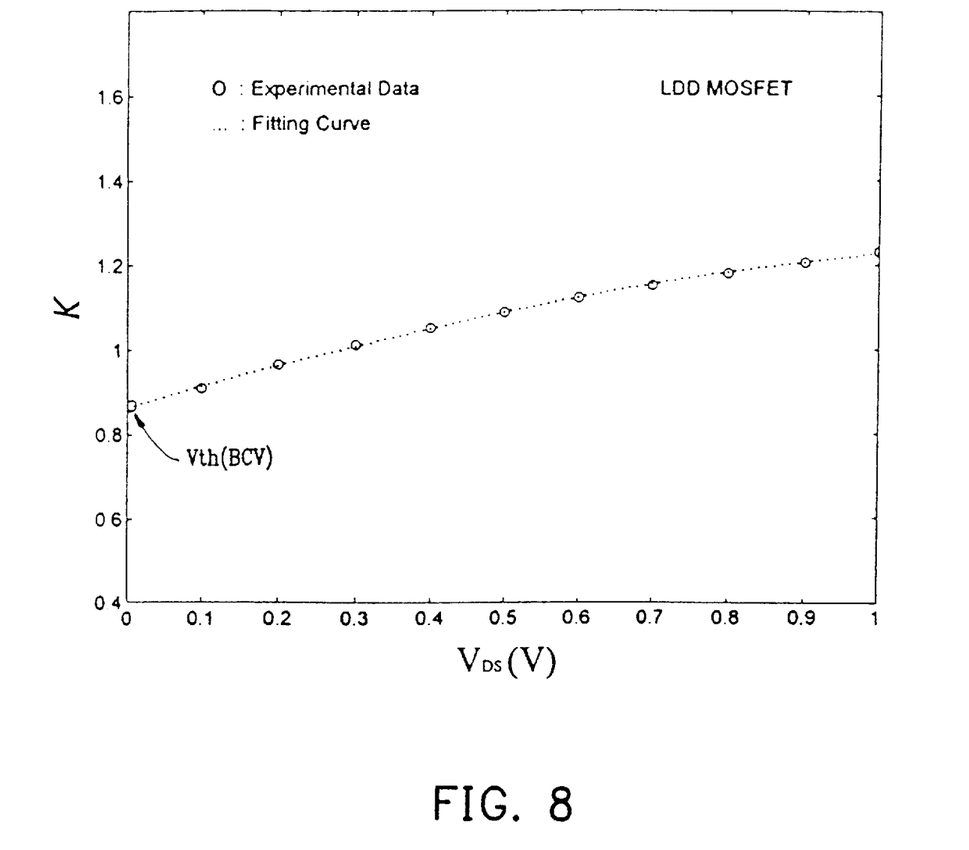
FIG. 8 is a graph, showing a plot of K parameter versus $V_{DS}$ for an LDD n-channel MOSFET device.

In the final step 60, from the data obtained from step 50, a plot of K versus $V_{DS}$ is drawn on a graph with $V_{DS}$ as the horizontal axis and K as the vertical axis. FIG. 7 shows the plot of K versus $V_{DS}$ for a DDD n-channel MOSFET device and FIG. 8 shows the plot for an LDD n-channel MOSFET device.

The DDD n-channel MOSFET device on which tests were performed as described above, was formed on a p-substrate with a doping concentration of about $4 \times 10^{16}$ atoms /cm$^3$. The gate oxide layer was deposited to a thickness of about 250 Å, and the implantation of boron or phosphorus ions was used to adjust the threshold voltage of this DDD n-channel MOSFET device. Further, this MOSFET device had a channel length (L) of 0.8 $\mu$m and a channel width (W) of 50 $\mu$m. The measurements were carried out at room temperature and taken by PC-controlled equipment such as the KEITHLEY 236/237/238, and HP4145, HP4155, HP4156.

The LDD n-channel MOSFET device used for the test was formed on a p-substrate with a doping concentration of about $1.5 \times 10^{15}$ atoms/cm$^3$. The gate oxide layer was deposited to a thickness of about 253 Å and boron was implanted to adjust the threshold voltage of this LDD n-channel MOSFET device. Further, this MOSFET device had a channel length (L) of 1.0 $\mu$m and a channel width (W) of 20 $\mu$m. All the conditions set up for the measurements were the same as those for the foregoing DDD n-channel MOSFET device.

In accordance with the invention, the threshold voltage of the foregoing DDD n-channel MOSFET device is obtained by extrapolating the plot of K versus $V_{DS}$ in FIG. 7 to intercept the K axis (where $V_{DS}=0$) at a point indicated by $V_{th}(BCV)$. The value of the point $V_{th}(BCV)$ on the K axis is then taken as the threshold voltage of the DDD n-channel MOSFET device. That is, the value of $V_{GS}$ corresponding to the value of K at the K intercept is taken to be $V_{th}(BCV)$.

Similarly, the threshold voltage of the foregoing LDD n-channel MOSFET device is obtained by extrapolating the plot of K versus $V_{DS}$ in FIG. 8 to intercept the K axis (where $V_{DS}=0$) at a point indicated by $V_{th}(BCV)$. The value of the point $V_{th}(BCV)$ on the K axis is then taken as the threshold voltage of the LDD n-channel MOSFET device.

From the foregoing description, it is apparent that the invention allows the threshold voltage to be more accurately obtained by decrementing $V_{DS}$ toward zero, rather than keeping $V_{DS}$ at a constant level, as in the prior art. The point is that $V_{DS}$ is varied within a range, one extreme of which approaches zero. To increase the level of accuracy still further, $V_{DS}$ can be varied each time by a smaller increment, for example 0.05V rather than 0.1V.

The method according to the invention is not limited to measuring the threshold voltage of n-channel MOSFET devices as illustrated in the foregoing examples. It can be also used to measure the threshold voltage of p-channel MOSFET devices. In this case, the drain-to-source voltage $V_{DS}$ and gate-to-source voltage $V_{GS}$ are changed in polarity. These MOSFET devices can be based on a substrate made of germanium, silicon, or diamond or of the type having a silicon on insulator (SOI) structure. MOSFET devices fabricated by submicron technologies are also applicable.

The invention has been described with exemplary preferred embodiments. However, it is to be understood that the scope of the invention is not limited to the disclosed embodiments. To the contrary, it is intended to cover various modifications and similar procedures. The appended claims, therefore, should be accorded the broadest interpretation so as to encompass all such modifications and similar procedures.

What is claimed is:

1. A method for measuring the threshold voltage of a MOSFET device having a source, a drain, and a gate, all formed on a substrate, the method comprising the steps of:
   (1) applying a variable DC voltage between the drain and the source, and grounding the source and the substrate;
   (2) varying the drain-to-source voltage among a first predetermined number of levels in a first range;
   (3) repeating the following steps for each level of the drain-to-source voltage:
      (i) applying a variable DC voltage between the gate and the source, and varying the gate-to-source voltage among a second predetermined number of levels in a second range,
      (ii) measuring the current flowing between the drain and the source for each level of the gate-to-source voltage,
      (iii) plotting a first curve which represents a drain-to-source current versus gate-to-source voltage characteristic,
      (iv) determining the position of a point on the plot for which a line tangential to the point has a slope that is maximum for the plot, and
      (v) linearly extrapolating the maximum slope line to obtain one K parameter value which is the intercept of the maximum slope line with the gate-to-source axis;
   (4) plotting a second curve which represents the K parameter versus drain-to-source voltage characteristic; and
   (5) extrapolating the second curve to obtain the intercept of the second curve with the K parameter axis, the intercept representing the threshold voltage of the MOSFET device.

2. A method as claimed in claim 1, wherein the first range is from about 0.1V to about 1V.

3. A method as claimed in claim 2, wherein said step (2) includes the step of incrementing the drain-to-source voltage by about 0.1V within the first range.

4. A method as claimed in claim 1, wherein the second range is from about 0V to about 5V.

5. A method as claimed in claim 4, wherein said step (i) includes the step of incrementing the gate-to-source voltage by about 0.1V within the second range.

6. A method as claimed in claim 1, wherein the MOFSET device is a DDD n-channel MOSFET device.

7. A method as claimed in claim 1, wherein the the MOFSET device is an LDD n-channel MOSFET device.

* * * * *

UNITED STATES PATENT AND TRADEMARK OFFICE
CERTIFICATE OF CORRECTION

PATENT NO. : 5,938,164
DATED : August 17, 1999
INVENTOR(S) : James A. Kargol, Robert W. Jones, Bruce A. Hiemstra, Marc D. Hewko, Yannis Poulos, Ronald R. Siegrist, Wee Tzee Gam, David W. Husted, Chester S. Fudala It is certified that error appears in the above-indentified patent and that said Letters Patent is hereby corrected as shown below:

In column 1, line 5, change "5,707,036" to --5,707,035--.

Signed and Sealed this

First Day of February, 2000

Attest:

Q. TODD DICKINSON

*Attesting Officer*  *Acting Commissioner of Patents and Trademarks*